(12) United States Patent
Cheng et al.

(10) Patent No.: US 9,608,068 B2
(45) Date of Patent: Mar. 28, 2017

(54) SUBSTRATE WITH STRAINED AND RELAXED SILICON REGIONS

(71) Applicant: International Business Machines Corporation, Armonk, NY (US)

(72) Inventors: Kangguo Cheng, Schenectady, NY (US); Bruce B. Doris, Slingerlands, NY (US); Pouya Hashemi, White Plains, NY (US); Hong He, Schenectady, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/819,244

(22) Filed: Aug. 5, 2015

(65) Prior Publication Data

US 2017/0040417 A1    Feb. 9, 2017

(51) Int. Cl.
*H01L 29/10* (2006.01)
*H01L 21/762* (2006.01)
*H01L 21/02* (2006.01)

(52) U.S. Cl.
CPC .... *H01L 29/1054* (2013.01); *H01L 21/02532* (2013.01); *H01L 21/02647* (2013.01); *H01L 21/76254* (2013.01)

(58) Field of Classification Search
CPC .......... H01L 29/10; H01L 29/1054; H01L 21/02647; H01L 21/76254; H01L 21/0245
See application file for complete search history.

(56) References Cited

U.S. PATENT DOCUMENTS

| 7,307,273 | B2 | 12/2007 | Currie |
| 7,524,740 | B1 | 4/2009 | Liu et al. |
| 7,704,855 | B2 | 4/2010 | Furukawa et al. |
| 8,895,381 | B1 | 11/2014 | Cheng et al. |
| 2004/0266055 | A1* | 12/2004 | Ravi ............ C23C 16/272 438/105 |
| 2005/0153524 | A1* | 7/2005 | Maa ............ H01L 21/76254 438/458 |
| 2006/0267017 | A1* | 11/2006 | Noguchi ........ H01L 29/66742 257/66 |
| 2008/0261055 | A1* | 10/2008 | Chu ............ C23C 16/029 428/428 |
| 2010/0019276 | A1* | 1/2010 | Jang ............ H01L 29/7789 257/190 |
| 2013/0037858 | A1* | 2/2013 | Hong ............ H01L 21/02381 257/201 |
| 2014/0008729 | A1 | 1/2014 | Bedell et al. |
| 2015/0021692 | A1 | 1/2015 | Boeuf et al. |

* cited by examiner

*Primary Examiner* — Phuc Dang
(74) *Attorney, Agent, or Firm* — Louis J. Percello, Esq.; Otterstedt, Ellenbogen & Kammer, LLP

(57) ABSTRACT

A method is provided for forming an integrated circuit. A trench is formed in a substrate. Subsequently, a silicon-germanium feature is formed in the trench, and an etch stop layer is formed on the substrate and on the silicon-germanium feature. Lastly, a silicon device layer is formed on the etch stop layer. The silicon device layer has a tensily-strained region overlying the silicon-germanium feature. Regions of the silicon device layer not overlying the silicon-germanium feature are less strained than the tensily-strained region. The tensily-strained region of the silicon device layer may be further processed into channel features in n-type field effect transistors with improved charge carrier mobilities and device drive currents.

19 Claims, 11 Drawing Sheets

SUBSTRATE WITH STRAINED AND RELAXED SILICON REGIONS

BACKGROUND OF THE INVENTION

The present invention relates to the electrical, electronic, and computer arts, and, more particularly, to methods for forming substrates with both strained and relaxed silicon regions, and substrates formed thereby.

The inclusion of strained channels in modern metal-oxide-semiconductor field effect transistor (MOSFET) devices holds the promise of increased charge carrier mobilities and transistor device currents. The performance of an n-type field effect transistor (NFET) is typically improved if its channel includes biaxially strained silicon with tensile strain.

Because of lattice mismatches, tensily strained silicon may be formed by epitaxially growing silicon on relaxed silicon-germanium. Such a technique is, for example, utilized when forming wafers by Strained-Si-Directly-on-Insulator (SSDOI) fabrication methodologies. During SSDOI fabrication, a strained silicon layer is typically grown on a silicon-germanium buffer layer of about 1-2 micrometers thickness. Subsequent processing, which includes wafer bonding to a thermally oxidized handle wafer, provides a wafer entirely covered in a strained silicon layer that overlies a thermal oxide layer.

BRIEF SUMMARY

Embodiments of the invention provide methods for forming semiconductor-on-insulator (SOI) substrates with regions of tensily strained silicon and relaxed silicon. Advantageously, the tensily strained regions may be used to form channel features in NFET devices, allowing those NFETs to benefit from increased charge carrier mobilities and transistor device currents.

Aspects of the invention are directed to a method for forming an integrated circuit. A first trench is formed in a first substrate. Subsequently, a silicon-germanium feature is formed in the trench, and an etch stop layer is formed on the first substrate and on the silicon-germanium feature. Lastly, a silicon device layer is formed on the etch stop layer with a tensily-strained region overlying the silicon-germanium feature.

Other aspects of the invention, moreover, are directed to an integrated circuit formed using a method comprising the steps set forth in the previous paragraph.

Finally, even additional aspects of the invention are directed to a film stack comprising a substrate, a dielectric layer, and an intact silicon device layer. The dielectric layer overlies the substrate. The intact silicon device layer overlies the dielectric layer and is characterized by a first region that is more tensily strained than a second region.

Techniques according to embodiments of the present invention can provide substantial beneficial technical effects. By way of example only, one or more embodiments may provide advantages including, but not limited to: forming substrates with both strained and relaxed silicon regions, and substrates formed thereby; and improving the performance of an NFET device by including a channel formed having biaxially strained silicon with tensile strain.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

The present invention will be described with reference to illustrative embodiments. For this reason, numerous modifications can be made to these embodiments and the results will still come within the scope of the invention. No limitations with respect to the specific embodiments described herein are intended or should be inferred.

As the term is used herein and in the appended claims, "about" means within plus or minus ten percent.

Figure 1A:
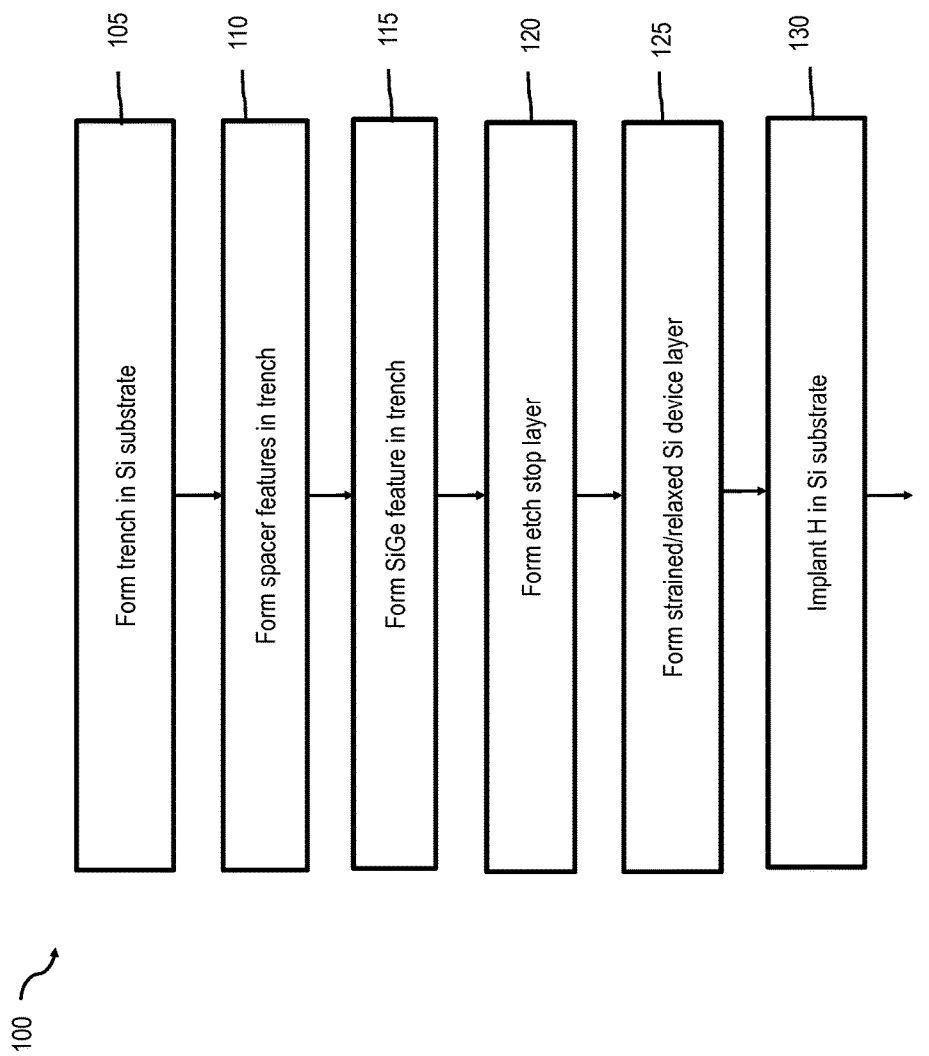
FIGS. 1A and 1B show a flow diagram of a method for forming a base structure of an integrated circuit, in accordance with an illustrative embodiment of the invention.
Figure 1B:
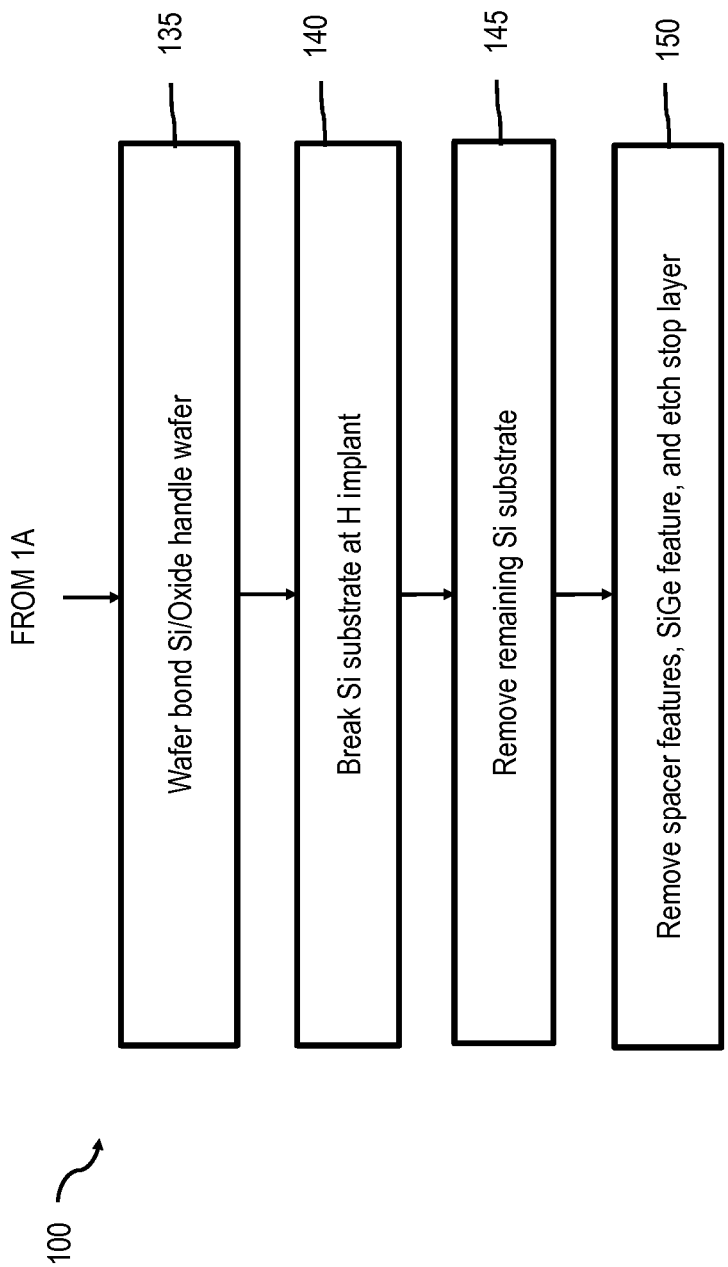

FIGS. 1A and 1B show a flow diagram of a method 100 in accordance with an illustrative embodiment of the invention for forming a base structure for use in fabricating a complementary metal-oxide-semiconductor (CMOS) integrated circuit. FIGS. 2-10, in turn, show sectional views of intermediate film stacks formed during the illustrative integrated circuit processing. Although the method 100 and the structures formed thereby are entirely novel, one or more individual processing steps required to implement the method 100 may utilize conventional semiconductor fabrication techniques and conventional semiconductor fabrication tooling. These techniques and tooling will already be familiar to one having ordinary skill in the relevant arts given the teachings herein. Moreover, details of the individual processing steps used to fabricate semiconductor devices described herein may be found in a number of publications, for example, S. Wolf and R. N. Tauber, *Silicon Processing for the VLSI Era, Volume* 1, Lattice Press, 1986; S. Wolf, *Silicon Processing for the VLSI Era, Vol. 4: Deep-Submicron Process Technology*, Lattice Press, 2003; and S. M. Sze, *VLSI Technology, Second Edition*, McGraw-Hill, 1988, all of which are incorporated by reference herein.

It is also emphasized that the descriptions provided herein are not intended to encompass all of the processing steps that may be required to successfully form a functional device. Rather, certain processing steps that are conventionally used in forming integrated circuit devices, such as, for example, wet cleaning steps and annealing steps, are purposefully not described herein for economy of description. However, one skilled in the art will readily recognize those processing steps omitted from this more generalized description.

Figure 2:
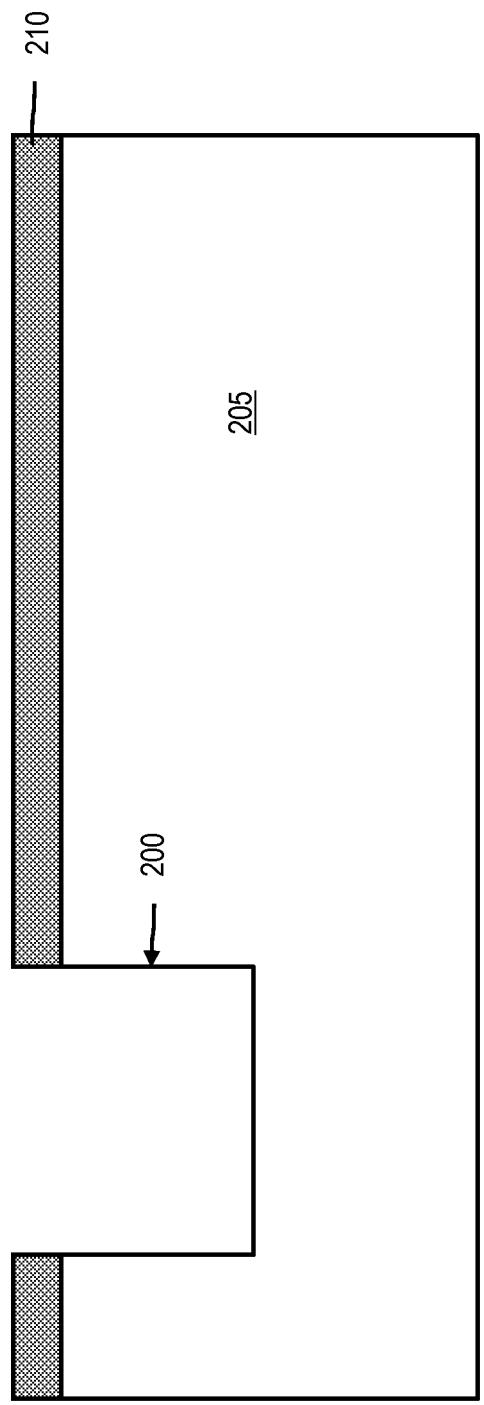
FIGS. 2-10 show sectional views of intermediate film stacks formed when performing the method set forth in FIGS. 1A and 1B, according to an embodiment of the invention.

The exemplary method 100 starts in step 105 with the formation of a trench 200 in a first substrate 205. The first substrate 205 may, for example, be in the form of a silicon wafer. Initially a hard mask layer 210 is deposited on the first substrate 205 and patterned using conventional lithography and reactive ion etching (RIE). In one or more embodiments, the hard mask layer 210 may comprise, for example, silicon nitride. After stripping the photoresist, the hard mask layer 210 is then used as a mask for etching the trench 200 via RIE. The resultant film stack is shown in FIG. 2.

Figure 3:
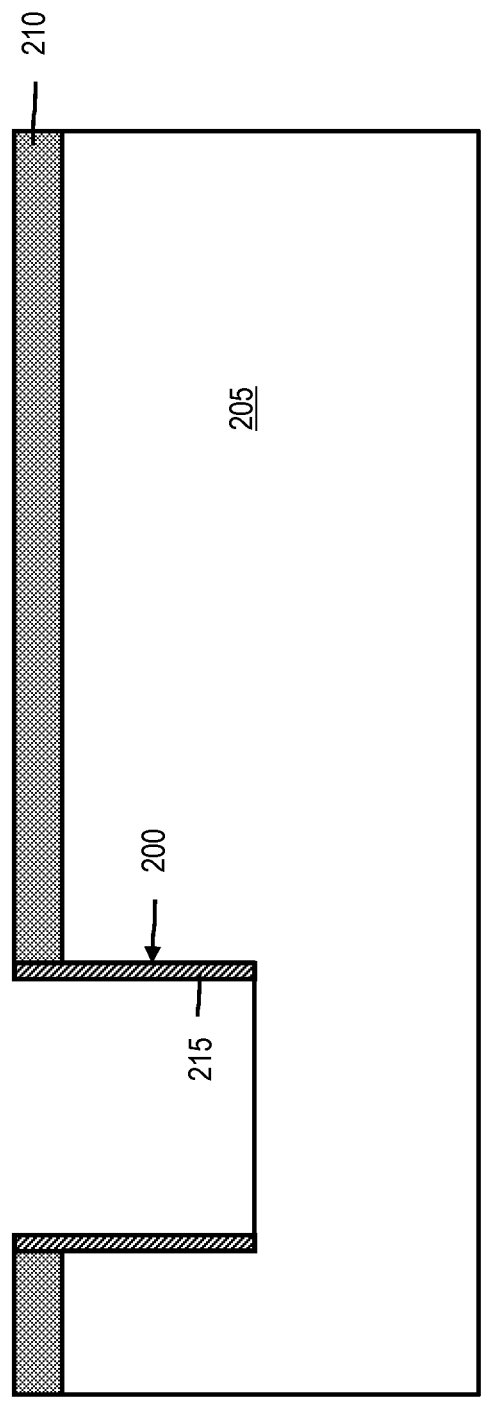

Subsequently, in step 110, spacer features 215 are formed on opposed sidewalls of the trench 200. The spacer features 215 may also comprise, for example, silicon nitride. As is common when forming such spacer features, the spacer features 215 may be formed by depositing the spacer material via chemical vapor deposition (CVD), and then etching the horizontally-oriented regions of spacer material on top of the hard mask layer 210 and at the bottom of the trench 200 via an anisotropic etching process such as RIE. The resultant film stack with the spacer features 215 in place is shown in FIG. 3.

In step 115, a silicon-germanium feature 220 is formed in the trench 200. Initially, in a first sub-step, a silicon-germanium layer is formed on the film stack in FIG. 3. Deposition may be by, for example, vapor-phase epitaxial growth in either a multi-wafer or a single-wafer reactor. When using a multi-wafer reactor, any native oxide on the surface of the first substrate 205 (at the bottom of the trench 200) may be initially removed by dipping the wafer in diluted hydrofluoric acid. In addition to removing the native oxide, this wet etch also acts to terminate the surface of the first substrate 205 in hydrogen. The wafer may then be introduced into the multi-wafer reactor, where it is exposed to silane, germanium, and hydrogen in the milli-torr total pressure range and at about 500-700° C. Single-wafer processing may be performed in a single-wafer reactor with similar processing parameters, but the wet etch to remove the native oxide may be replaced by an in-situ high temperature anneal by rapid thermal processing (RTP) to sublimate that oxide. Single-wafer reactors capable of depositing silicon-germanium are available from, for example, Applied Materials (Santa Clara, Calif., USA).

The just-deposited silicon-germanium layer is preferably overgrown somewhat during its deposition to allow the silicon-germanium layer and ultimately the silicon-germanium feature 220 to be fully relaxed (i.e., have minimum internal strain). During deposition of the silicon-germanium, the concentration of germanium may be held substantially constant, or, in alternative embodiments, may be graded. The silicon-germanium deposition may, for example, be characterized by a straight or graded germanium concentration profile with a germanium concentration maintained in the 10-40 atomic percent range, although this range is meant to be purely illustrative and is not intended to limit the scope of the invention.

Figure 4:
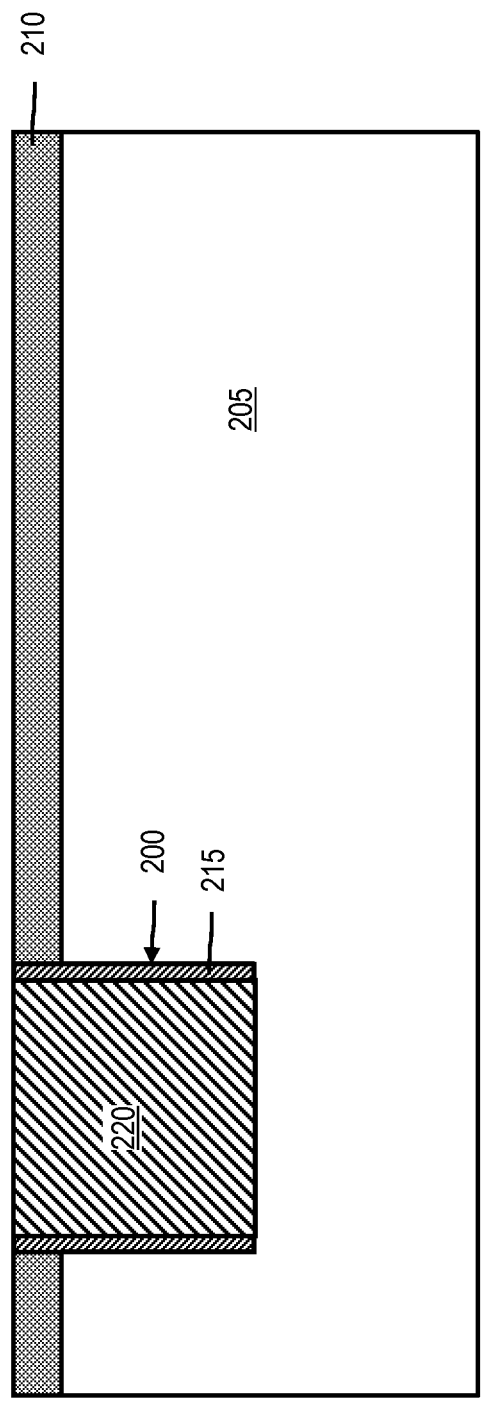

Once deposited, the silicon-germanium may be planarized down to the hard mask layer 210 by chemical-mechanical polishing (CMP) to yield the film stack shown in FIG. 4, now with the defined silicon-germanium feature 220. In combination with this CMP step or in a separate CMP step, moreover, the silicon-germanium feature 220, the hard mask layer 210, and the tops of the spacer features 215 may be further polished so that the hard mask layer 210 is completely removed and the tops of the silicon-germanium feature 220 and the spacer features 215 are level with the top of the first substrate 205. The resultant film stack is shown in FIG. 5.

Figure 5:
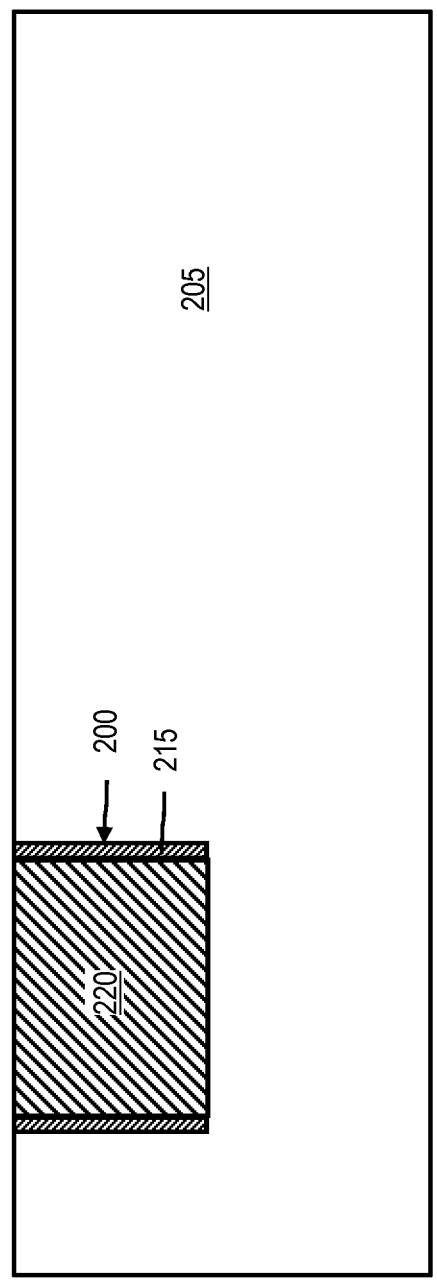

Next, in step 120, an etch stop layer 225 is formed on the film stack in FIG. 5. The etch stop layer may comprise, for example, more silicon-germanium. Deposition may again be by vapor-phase epitaxial growth. A silicon device layer 230 is then deposited on the etch stop layer 225, as indicated in step 125. Here, processing may occur by depositing by silicon epitaxy at elevated temperature (e.g., above about 600° C.) utilizing a gaseous source of silicon (e.g., silane, silicon tetrachloride, dichlorosilane), and hydrogen as reactants. Doping may also be incorporated by the addition of, for example, a source of phosphorous (e.g., phosphine).

Figure 6:
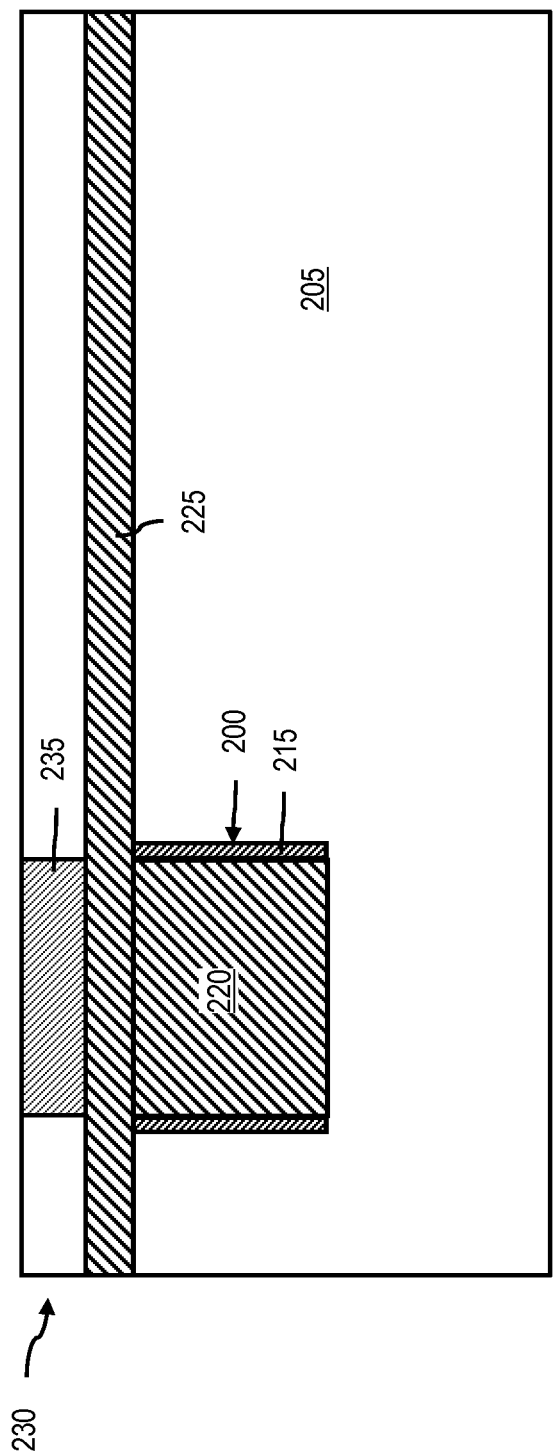

Depositing the silicon device layer 230 in this manner produces the film stack shown in FIG. 6. Notably, the silicon device layer 230 includes a tensily-strained region 235 overlying the silicon-germanium feature 220. Because germanium is larger than silicon, a lattice mismatch is present between the newly deposited silicon and the highly-ordered, largely defect-free silicon-germanium immediately underlying it. In contrast, in those regions of the silicon device layer 230 not overlying the silicon-germanium feature, the silicon device layer 230 is substantially less strained. The relaxed state of the regions of the silicon device layer 230 that do not overlie the silicon-germanium feature 220 occurs because the etch stop layer 225 is too thin to be highly ordered in these regions, and thus the silicon device layer 230 does not feel the effect of any underlying silicon-germanium to the extent it does immediately over the silicon-germanium feature 220.

The silicon device layer 230 is thus a mixture of more and less strained regions with the underlying silicon-germanium feature 220 determining the region of tensile strain. Empirically, it has been determined that trench depths of greater than about 100 nanometers (nm) allow silicon-germanium features 220 to be grown with sufficient order and lack of defects to produce an overlying tensily-strained region of silicon suitable for processing into strain-enhanced channel features in NFETs. This trench depth is an order of magnitude less than the 1-2 micrometer thicknesses of silicon-germanium buffer layers used in convectional SSDOI processing. In one or more embodiments, when producing 10 nm NFET devices, the widths of the trenches 200 may be about 480 nm so as to accommodate ten tracks with 48 nm pitch, although this width value is solely by way of illustration and would be very design specific.

Figure 7:
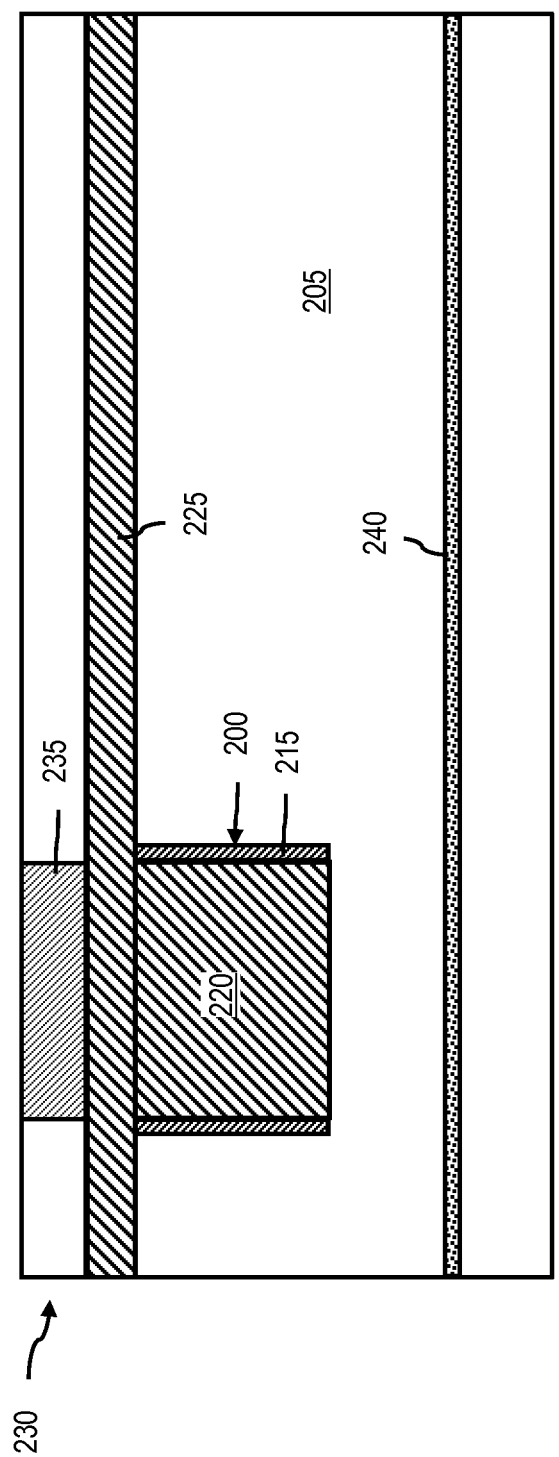
Figure 8:
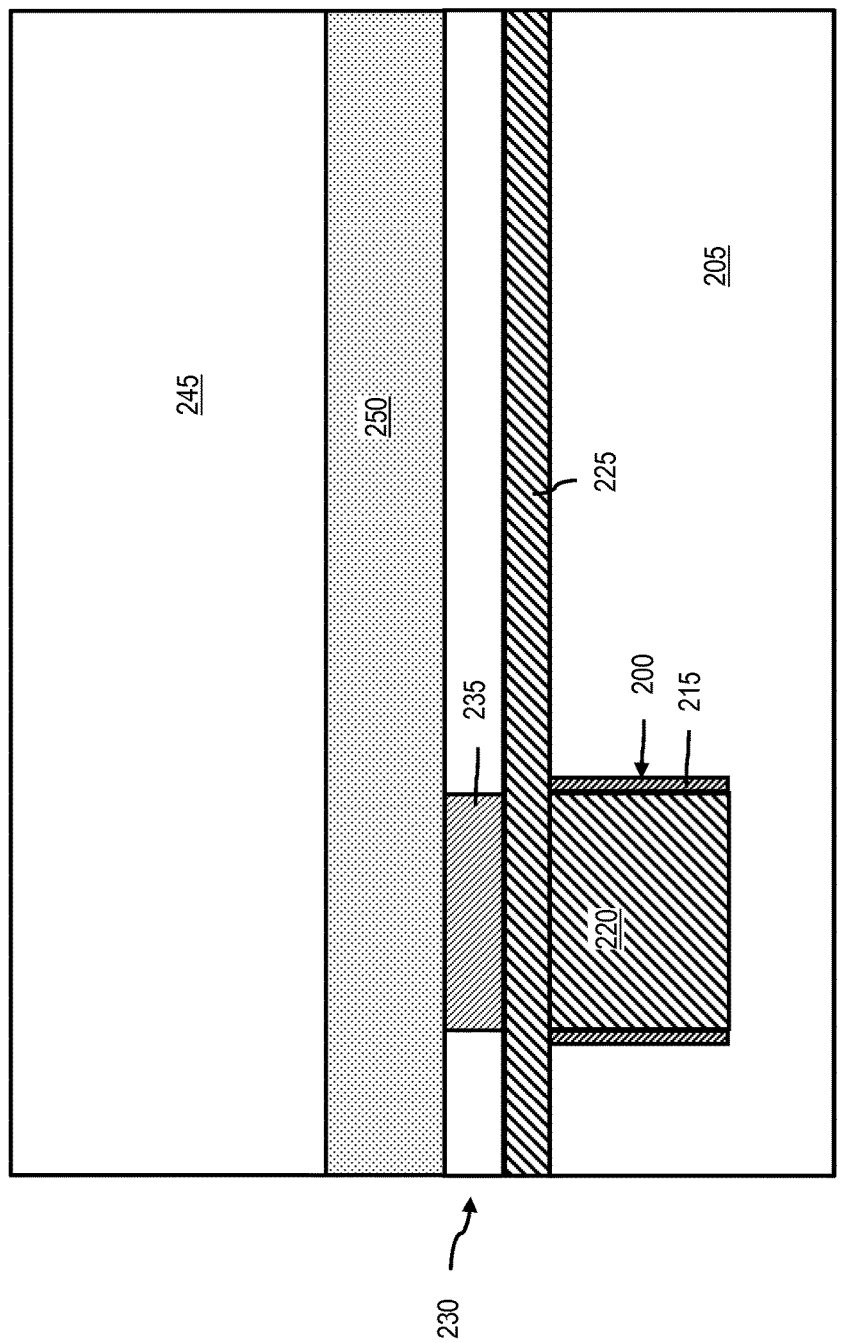
Figure 9:
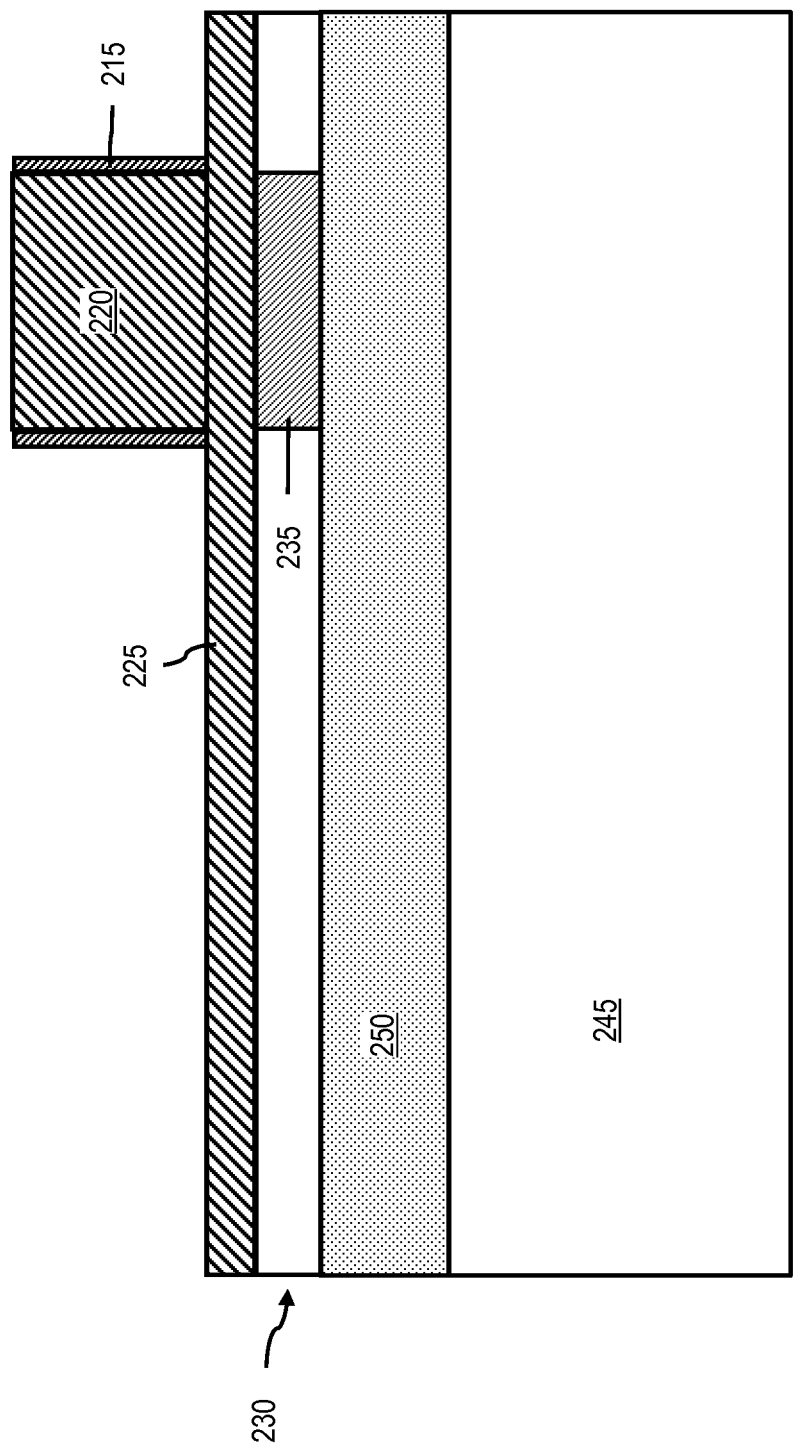

The remainder of the processing steps in the method 100 involve placing the silicon device layer 230 over a layer of silicon dioxide to, in effect, produce a silicon-on-insulator (SOI) substrate suitable for further CMOS processing into a desired integrated circuit. In step 130, hydrogen is implanted into the first substrate 205 to a depth below the above-identified features to create a narrow layer of hydrogen 240, as shown in FIG. 7. Subsequently, in step 135, a second substrate 245 (e.g., silicon) covered in a dielectric layer 250 (e.g., silicon dioxide) (collectively, a "handle" wafer) is wafer bonded to the top of the film stack in FIG. 7 with the dielectric layer 250 contacting the top of the silicon device layer 230. In step 140, the first substrate 205 is broken along the implanted hydrogen layer 240 by annealing the film stack. The resultant film stack is shown in FIG. 8.

Both the wafer bonding process involved in step 135 and the breaking of the first substrate via the hydrogen implant/anneal processing involved in steps 130 and 140 are common processing steps when forming SOI wafers, and, as a result, will already be familiar to one skilled in the relevant semiconductor processing arts. A process for wafer bonding, moreover, is described in U.S. Pat. No. 4,771,016 to Bajor et al. and entitled "Using rapid thermal process for manufacturing of wafer bonded SOI semiconductor," which is hereby incorporated by reference herein. Breaking silicon via hydrogen implant/anneal (sometimes called a SMART CUT® process (registered trademark of S.O.I. TEC Silicon on Insulator Technologies Corp. (Bernin, France))) is described in U.S. Pat. No. 5,374,564 to Bruel and entitled "Process for the production of thin semiconductor material films," which is also hereby incorporated by reference herein.

The above-described breaking of the first substrate in step 140 acts to reduce the thickness of the first substrate 205 and, in so doing, helps to facilitate complete removal of the first substrate 205 in step 145. In step 145, the remaining portion of the first substrate 205 is removed by, for example, wet etching selective to the silicon-germanium feature 220, the etch stop layer 225, and the spacer features 215. During this etching, the etch stop layer 225 stops the silicon device layer 230 from being impacted, resulting in the film stack shown in FIG. 9. Wet etching may involve, for example, a solution comprising hot (e.g., near 80° C.) tetramethylammonium hydroxide, which can be very selective to silicon-germanium. It is noted that, in FIG. 9, the film stack is flipped vertically with respect to the previous figures to place the dielectric layer 250 (i.e., buried oxide) under the silicon device layer 230, as is conventional when showing SOI substrates.

Figure 10:
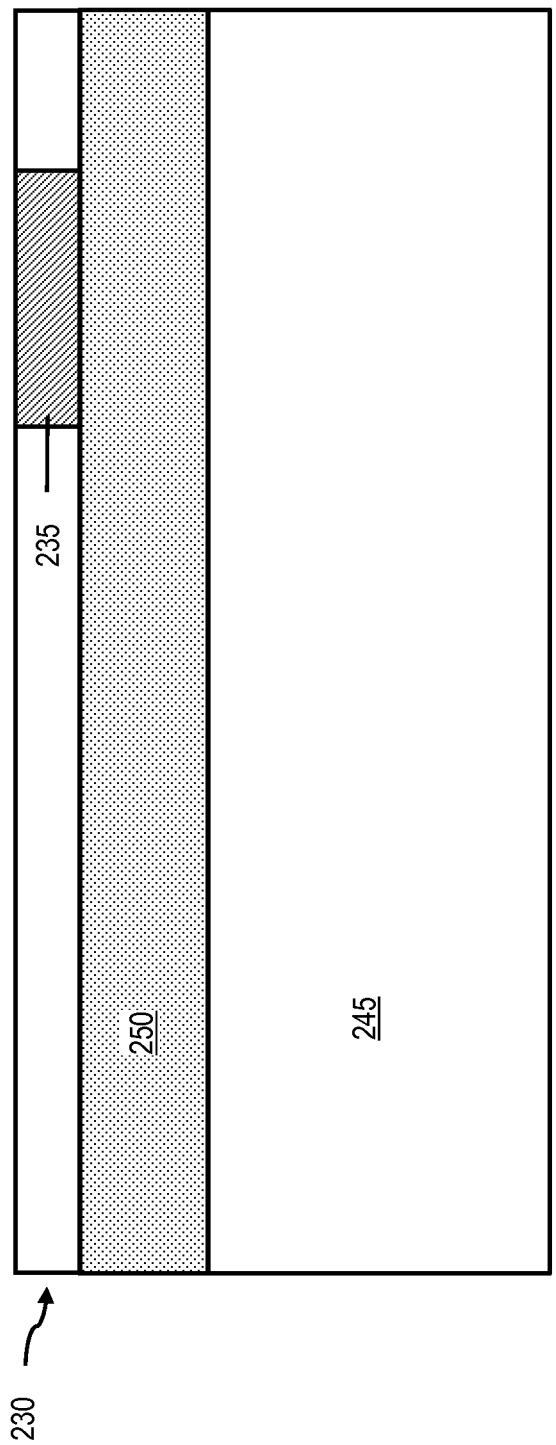

Finally, in step 150, the spacer features 215, silicon-germanium feature 220, and the etch stop layer 225 are removed. Again, wet etching may be utilized, with the etching of the silicon-germanium feature 220 and the etch stop layer 225 being selective to the silicon device layer 230. Silicon-germanium wet etching selective to silicon has been demonstrated with solutions comprising, for example, hydrogen peroxide, hydrofluoric acid, and acetic acid. Alternatively, the silicon-germanium may be removed by rapid thermal processing in an ambient comprising gaseous hydrofluoric acid. The resultant film stack is shown in FIG. 10.

Thus, to summarize, the method 100 comprises forming the silicon-germanium feature 220 in the trench 200 and then forming a silicon device layer 230 over the silicon-germanium feature 220. Because of lattice mismatches, the region of the silicon device layer 230 overlying the silicon-germanium feature 220 is tensily strained while other regions that do not overlie the silicon-germanium feature 220 are substantially less strained (i.e., relaxed). The patterning applied to the trench 200 thereby ultimately determines the placement and size of the island of strained silicon in the silicon device layer 230 after additional processing. The tensily-strained region 235 may subsequently be converted into channel features in NFETs via additional CMOS processing, allowing those NFETs to benefit from increased charge carrier mobilities and transistor device currents.

While an exemplary method of forming a base structure film stack is set forth above, film stacks so formed would also fall within the scope of the invention. An embodiment of the invention may, for example, comprise a silicon substrate topped by a dielectric layer (e.g., silicon dioxide). An intact, as-deposited silicon device layer overlying the dielectric layer may comprise a first region that is more tensily strained than a second region. That is, the intact silicon device layer will have both strained and relaxed regions. Such a film stack is shown in, for example, FIG. 10.

At the same time, it should again be emphasized that the above-described embodiments of the invention are intended to be illustrative only. Other embodiments may, for example, utilize different processing steps from those expressly set forth above to achieve embodiments falling within the scope of the invention.

In one or more embodiments, for example, the method 100 may be applied without the use of the spacer features 215. In so doing, step 110 may be eliminated, and step 150 may be modified to only remove the silicon-germanium feature 220 and the etch stop layer 225.

The method 100 as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

All the features disclosed herein may be replaced by alternative features serving the same, equivalent, or similar purposes, unless expressly stated otherwise. Thus, unless expressly stated otherwise, each feature disclosed is one example only of a generic series of equivalent or similar features.

Any element in a claim that does not explicitly state "means for" performing a specified function or "step for" performing a specified function is not to be interpreted as a "means for" or "step for" clause as specified in AIA 35 U.S.C. §112(f). In particular, the use of "steps of" in the claims herein is not intended to invoke the provisions of AIA 35 U.S.C. §112(f).

What is claimed is:

1. A method for forming an integrated circuit comprising the steps of:
   forming a trench in a first substrate;
   forming a silicon-germanium feature in the trench;
   forming an etch stop layer on the first substrate and on the silicon-germanium feature; and
   forming a silicon device layer on the etch stop layer, the silicon device layer comprising a first portion with a tensily-strained region overlying the silicon-germanium feature, and a second portion not overlying the silicon-germanium feature which is less tensily-strained relative to the first portion.

2. The method of claim 1, wherein the first substrate comprises silicon.

3. The method of claim 1, wherein the trench is greater than about 100 nanometers deep.

4. The method of claim 1, wherein the step of forming the silicon-germanium feature comprises vapor phase silicon-germanium epitaxy.

5. The method of claim 1, wherein the step of forming the silicon-germanium feature comprises chemical-mechanical polishing.

6. The method of claim 1, wherein the etch stop layer comprises silicon-germanium.

7. The method of claim 1, further comprising the step of forming spacer features along opposing sidewalls of the trench.

8. The method of claim 1, further comprising the steps of:
   implanting hydrogen; and annealing the first substrate to break the first substrate at a location of implanted hydrogen.

9. The method of claim 1, further comprising the step of forming at least a portion of the tensily-strained region into a channel in an n-type field effect transistor.

10. A method for forming an integrated circuit, the method comprising the steps of:
   forming a trench in a first substrate;
   forming a silicon-germanium feature in the trench;
   forming an etch stop layer on the first substrate and on the silicon-germanium feature;
   forming a silicon device layer on the etch stop layer with a tensily-strained region overlying the silicon-germanium feature;
   receiving a second substrate covered in a dielectric layer; and
   wafer bonding the silicon device layer to the dielectric layer.

11. The method of claim 10, wherein the second substrate comprises silicon.

12. The method of claim 10, wherein the dielectric layer comprises silicon dioxide.

13. The method of claim 10, further comprising the steps of:
   removing the first substrate; and
   removing the silicon-germanium feature and the etch stop layer.

14. The method of claim 13, wherein the step of removing the first substrate comprises etching the first substrate to the etch stop layer.

15. An integrated circuit formed by a method comprising the steps of:
   forming a trench in a first substrate;
   forming a silicon-germanium feature in the trench;
   forming an etch stop layer on the first substrate and on the silicon-germanium feature; and
   forming a silicon device layer on the etch stop layer, the silicon device layer comprising a first portion with a tensily-strained region overlying the silicon-germanium feature, and a second portion not overlying the silicon-germanium feature which is less tensily-strained relative to the first portion.

16. The integrated circuit of claim 15, further comprising the step of forming at least a portion of the tensily-strained region into a channel in an n-type field effect transistor.

17. A film stack comprising:
   a substrate;
   a dielectric layer overlying the substrate; and
   an intact silicon device layer overlying the dielectric layer, the silicon device layer comprising first and second regions, wherein the first region is more tensily strained than the second region.

18. The film stack of claim 17, wherein the substrate comprises silicon.

19. The film stack of claim 17, wherein the dielectric layer comprises silicon dioxide.

* * * * *